(12) United States Patent
Nepela

(10) Patent No.: US 7,482,298 B2
(45) Date of Patent: Jan. 27, 2009

(54) SUPERCONDUCTOR COMPOSITIONS OPERABLE AT HIGH TEMPERATURES

(76) Inventor: Daniel A. Nepela, 4505 7th St. S.E., Puyallup, WA (US) 98374

( * ) Notice: Subject to any disclaimer, the term of this patent is extended or adjusted under 35 U.S.C. 154(b) by 236 days.

(21) Appl. No.: 11/604,142

(22) Filed: Nov. 27, 2006

(65) Prior Publication Data

US 2008/0125323 A1     May 29, 2008

(51) Int. Cl.
*C04B 35/00* (2006.01)
(52) U.S. Cl. ............... 501/96.1; 501/96.3; 501/108; 420/402; 420/901; 423/155; 423/289
(58) Field of Classification Search ............... 501/96.1, 501/96.3, 108; 420/402, 901; 423/155, 289
See application file for complete search history.

(56) References Cited

OTHER PUBLICATIONS

"High-pressure synthesis of pure and doped superconducting MgB2 compounds." Toulemonde et al., Institue of Physics Publishing (2003), Supercond. Sci. Technol. 16 (2003) 231-236.*

* cited by examiner

*Primary Examiner*—Steven Bos
*Assistant Examiner*—Paul Wartalowicz

(57) ABSTRACT

The composition of compounds containing a multiplicity of different elements are optimized in general by full or partial substitutions of one or more of the atoms in such compounds so as to effect an Ne/χ value which represents a peak or near peak value in λ (the electron-phonon coupling constant) so as to maximize $T_c$ for such compositions of matter.

2 Claims, 4 Drawing Sheets

SUPERCONDUCTOR COMPOSITIONS OPERABLE AT HIGH TEMPERATURES

FIELD OF THE INVENTION

Figure 1A:
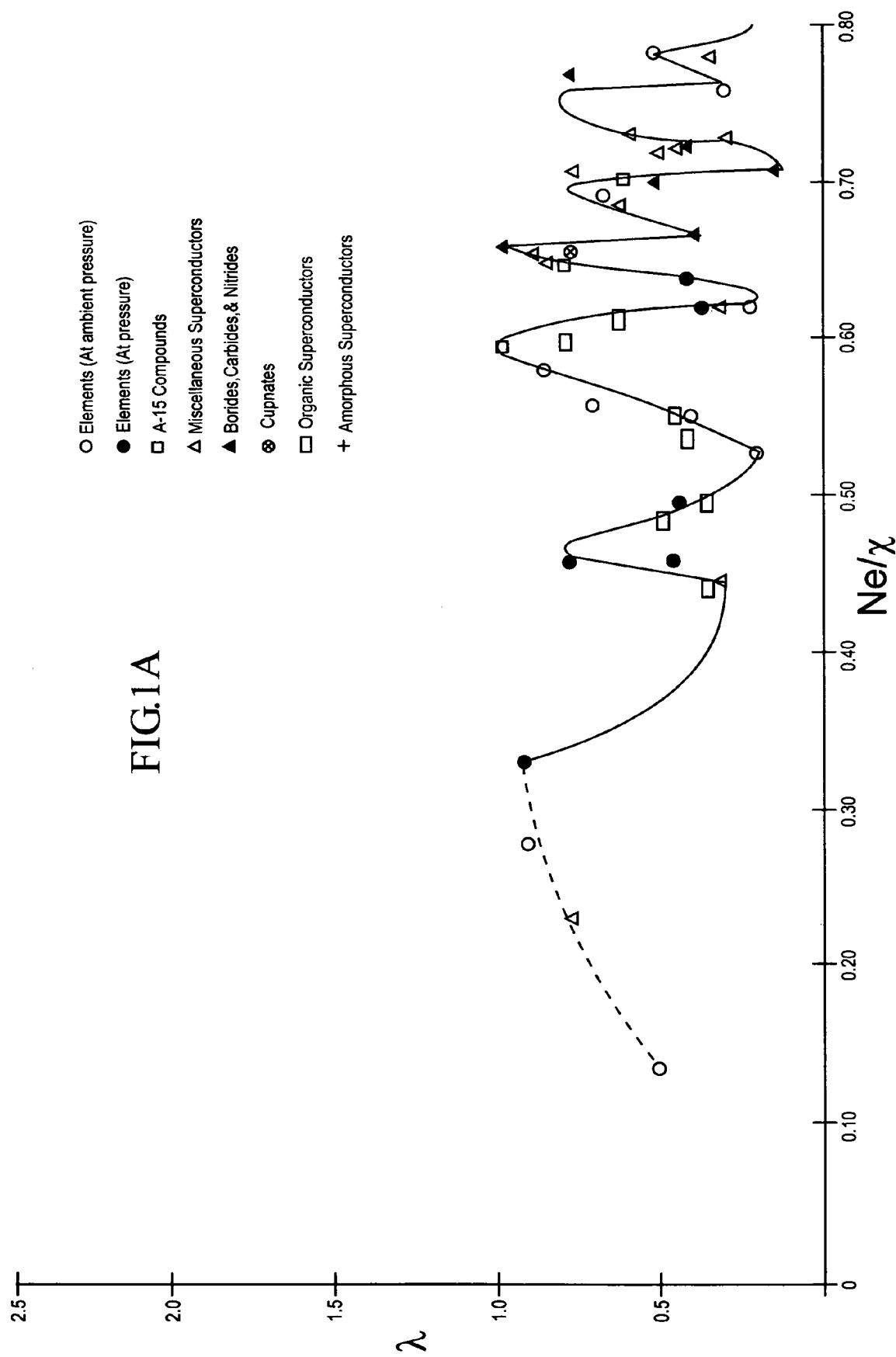

This invention relates to superconductor materials and in particular to compositions that result in superconductive characteristics at relatively high temperatures.

DESCRIPTION OF THE PRIOR ART

The Phenomenon of superconductivity occurs with certain metals and alloys when cooled to a very low characteristic transition temperature, superconductive elements, alloys or compounds will conduct electricity without resistance below a critical temperature $T_c$. Resistance is undesirable because it causes loss in energy flow through the material. Superconductivity, which was first discovered by Onnes in 1911, is characterized by the disappearance of all electrical resistance in a material below the transition temperature.

Superconductor materials have been found to be useful for various applications, such as superconducting magnets, magnetic resonance imaging, high sensitivity bolometer, and magnetoencephalography, among others. However, a major problem is the necessity to operate the superconductor material at a very low temperature, such as 4.2° K, which would require the use of liquid helium for example. Large and costly equipment is required and maintenance and repair are major problems.

In the article "Theory of Superconductivity" published in Physical Review, Dec. 1, 1957, page 1175, Bardeen, Cooper and Schrieffer proposed a theory of superconductivity (known as the BCS Theory) that delineates the properties of superconductors. The theory postulates that the interaction between electrons resulting from a virtual exchange of phonons is attractive when the energy difference between the electrons states involved is less than the phonon energy. The BCS theory, for which they were presented with a Nobel Prize in Physics, expresses the relation between $T_c$, a typical phonon energy ($\omega$), and the interaction strength N(O)V as $$T_c=1.14(\omega)\exp[-1/N[O]V]$$

This BCS equation for $T_c$ has been modified to include $\mu^*$, the coulomb pseudopotential. The modified equation $$T_c=1.14(\omega)\exp[-1/N[O]-\mu^*].$$

It should be noted that in the framework of the BCS theory, there is a formula for estimating the $T_c$. However, it is a general formula which does not take into account any specific feature of the superconducting materials.

In the 1975 publication by Allen-Dynes, Physical Review B, Vol. 18, #3, page 913, the value of $\mu^*$ is treated as a constant of 0.10, which value will be used in the explanation of the present invention.

In pages 75-77 of the text of Volume 21 of Physical Chemistry, published by Academic Press, R. T. Sanderson sets forth a principle of electronegativity equalization. The principle is that "When two or more atoms are initially different in electronegativity combine chemically, they become adjusted to the same intermediate electronegativity within the compound". The intermediate electronegativity may be defined as the geometric mean of the individual electronegativities of all of component atoms that make the compound formula. For example, if the $A_2B_3$ represents a compound of two atoms of A and three atoms of B, the electronegativity may be expressed as $$\chi_{(A2B3)}=(\chi_a^2\chi_b^3)^{1/5}$$

Andre Mourachkine points out in the text "Room-Temperature Superconducitivity", published in 2004 by International Science Publishing, at pages 21-22, that there is no theoretical formula for predicting the value of critical temperature in a given compound and that there is no rule for predicting whether a certain substance will undergo a superconducting transition at a particular temperature. The publication points out that a major problem in the field of superconductivity is how to calculate the critical temperature $T_c$ value in different materials by taking into account the specific features of a material.

In an article "Transition Temperatures of Strong Coupled Superconductors" by W. L. McMillan, Physical Review, Vol. 167, pg 334-367 (1968), McMillan provides a set of equations that allows for the calculation of $\lambda$ values from experimental values of $\theta_D$ and $T_c$ for a wide variety of superconductors. The McMillan article is incorporated herein by reference.

McMillan provides two principle equations:

$$T_c=\theta_D/1.45\exp[1.04(1+\lambda)/\lambda-\mu^*(1-0.62\lambda)]$$

and $\lambda=1.04 \mu^*\ln(\theta/1.45T_c)/(1-0.62 \mu^*)\ln(\theta/1.45T_c)-1.04$ The above equations are solved for a variety of superconductors (elements and compounds) using a constant $\mu^*=0.10$. McMillan's equations are valid only for $\lambda$ values between 0.33 and 0.90. Beyond those limits, error greater than 10% occurs for the calculated $\lambda$ values.

SUMMARY OF THE INVENTION

An object of this invention is to provide selected superconductor compositions that exhibit superconductivity at relatively high temperatures.

Figure 1B:
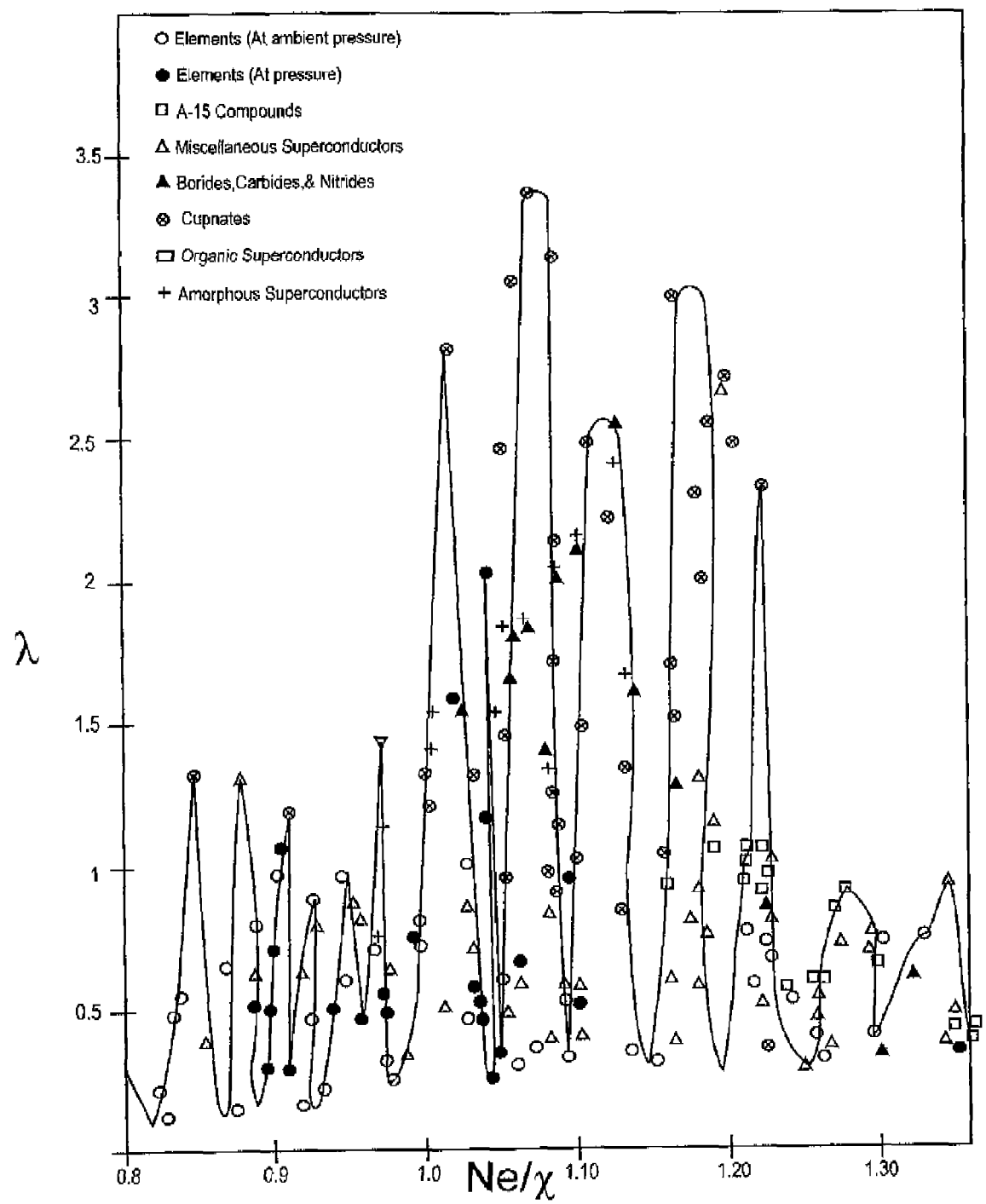
Figure 1C:
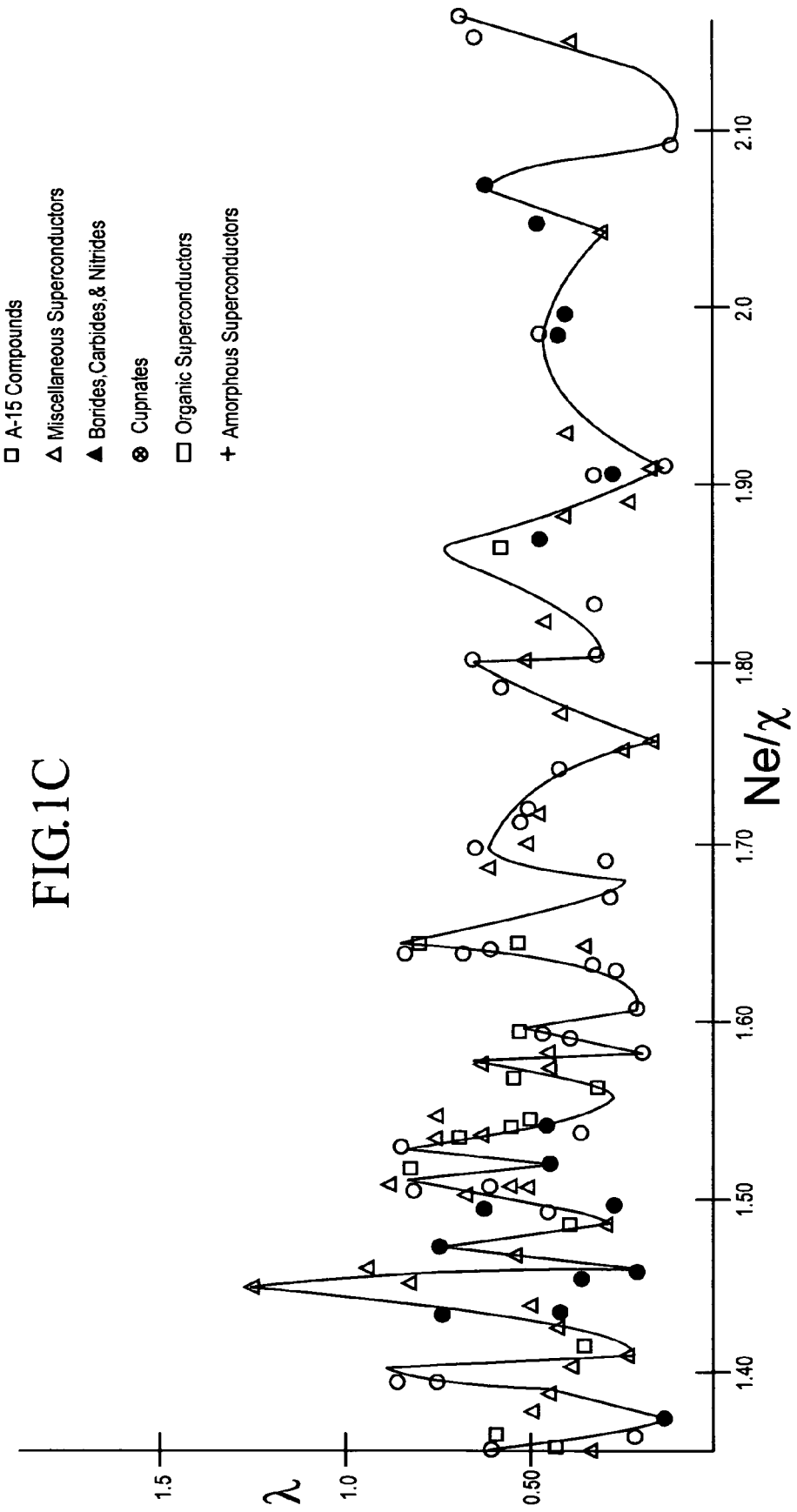
Figure 1D:
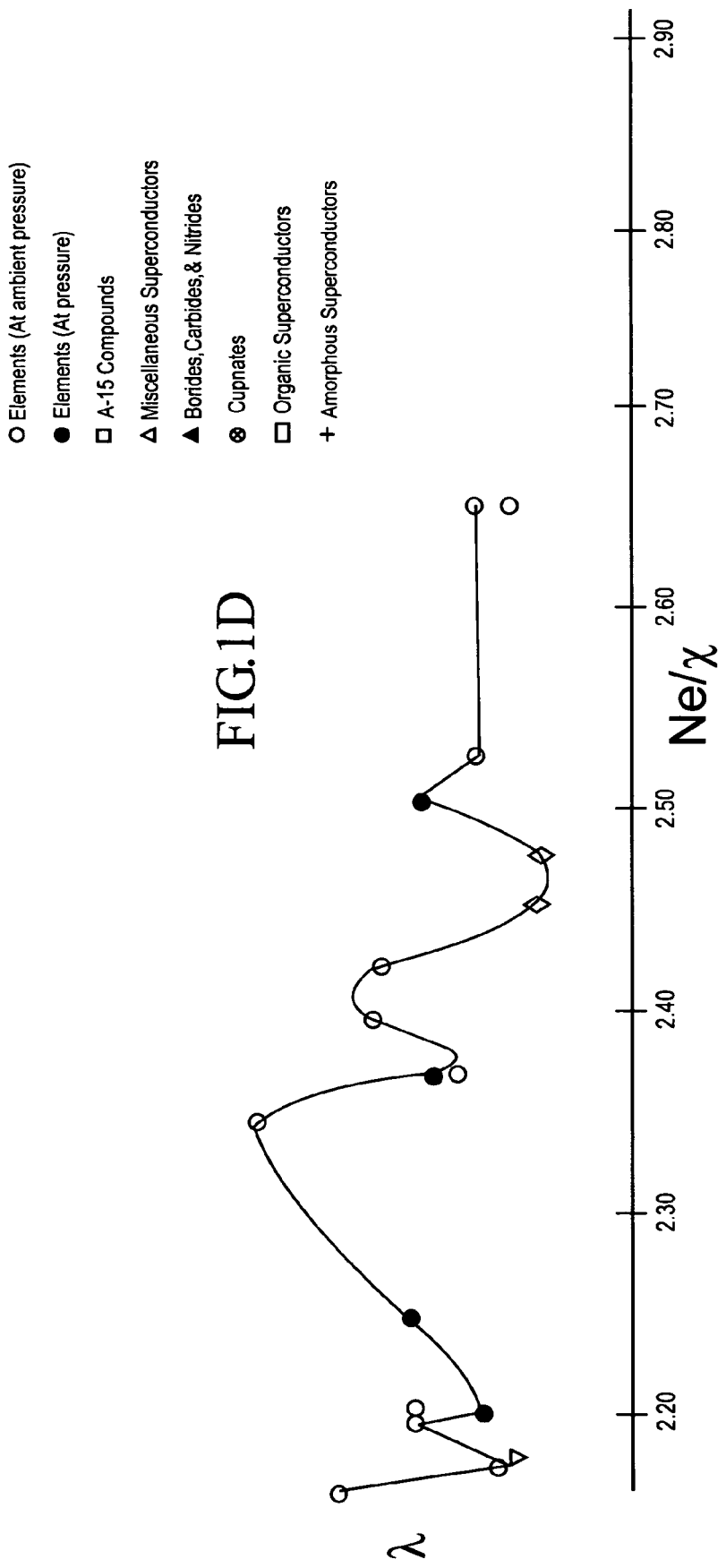

According to this invention novel superconductor compositions are established by taking into account the value of Ne/$\chi$ of any arbitrary composition where Ne is the average number of valance electrons in the composition of matter in question and $\chi$ is the absolute value of the electronegativity of such a composition. By utilizing prior experimental work by McMillan and Allen-Dynes we establish a new universal relationship which allows for the calculation of $\lambda$ (electron phonon coupling constant) and, from a universal equation developed from the McMillan and Allen-Dynes publication which is $\lambda=[(\ln \theta_D/2T_c)/2]^{-1}$. From these parameters we can construct the response of $\lambda$ (electron-phonon coupling constant) to Ne/$\chi$ for any composition of matter. The $\lambda$ response vs. Ne/$\chi$ is depicted in FIGS. 1a-1d and illustrates maxima in $\lambda$ at specific values of Ne/$\chi$. By design or selection of compositions of matter which possess peak (near peak) $\lambda$ values we are able to create novel compositions of matter that possess maximal values of $T_c$ for their atomic properties as defined by Ne and $\chi$ of such a composition and by the consequence of a peak or near peak value of $\lambda$. Additionally we have developed a relationship by which we can estimate the value of the Debye temperature for any arbitrary composition of matter. This relationship is $\theta_D$ (Debye Temperature)=exp [10.0−0.64(ln at. wt.+ln at. vol)]. Additionally if the composition of matter is amorphous the $\theta_D$ as calculated above is modified to be equal to 0.70 $\theta_D$ (crystalline).

The values of Ne, $\chi$ (absolute electronegativity) and the (In at. wt.+ln at. vol) of selected elements as used in this invention are depicted in Table 1. Additionally, Table 2 illustrates the Ne/$\chi$ values at peak positions of $\lambda$ and the peak value of $\lambda$ and limits thereof.

TABLE I

| Atomic no. | Symbol | Element | Metallic Valence Ne | ln At. wt. + ln At. Vol. | Absolute Electronegativity Electron Volts ($\chi$) |
|---|---|---|---|---|---|
| 1 | H | Hydrogen | 1 | 2.67 | 7.18 |
| 2 | He | Helium | 2 | | |
| 3 | Li | Lithium | 1 | 4.5 | 3.00 |
| 4 | Be | Beryllium | 2 | 4.25 | 4.6 ± 0.1 |
| 5 | B | Boron | 3 | 4.5 | 4.29 |
| 6 | C | Carbon | 4 | 4.34 | 6.26 |
| 7 | N | Nitrogen | 5 | 5.49 | 7.3 |
| 8 | O | Oxygen | 6 | 5.41 | 7.54 |
| 9 | F | Fluorine | 7 | 5.79 | 10.41 |
| 10 | Ne | Neon | 8 | | |
| 11 | Na | Sodium | 1 | 6.30 | 2.84 |
| 12 | Mg | Magnesium | 2 | 5.83 | 3.28 ± 0.5 |
| 13 | Al | Aluminum | 3 | 5.60 | 3.21 |
| 14 | Si | Silicon | 4 | 5.82 | 4.77 |
| 15 | P | Phosphorus | 5 | 6.26 | 5.62 |
| 16 | S | Sulfur | 6 | 6.26 | 6.22 |
| 17 | Cl | Chlorine | 7 | 6.50 | 8.3 |
| 18 | Ar | Argon | 8 | | |
| 19 | K | Potassium | 1 | 7.48 | 2.42 |
| 20 | Ca | Calcium | 2 | 6.94 | 3.07 |
| 21 | Sc | Scandium | 3 | 6.49 | 3.37 |
| 22 | Ti | Titanium | 4 | 6.23 | 3.46 |
| 23 | V | Vanadium | 5 | 6.08 | 3.64 |
| 24 | Cr | Chromium | 6 | 5.94 | 3.72 |
| 25 | Mn | Manganese | 7 | 6.04 | 3.72 |
| 26 | Fe | Iron | 8 | 5.98 | 4.02 |
| 27 | Co | Cobalt | 9 | 5.87 | 4.27 |
| 28 | Ni | Nickel | 10 | 5.96 | 4.39 |
| 29 | Cu | Copper | 11 | 6.11 | 4.48 |
| 30 | Zn | Zinc | 12 | 6.39 | 4.47 ± 0.1 |
| 31 | Ga | Gallium | 3 | 6.70 | 3.21 |
| 32 | Ge | Germanium | 4 | 6.89 | 4.56 |
| 33 | As | Arsenic | 5 | 6.89 | 5.31 |
| 34 | Se | Selenium | 6 | 7.17 | 5.89 |
| 35 | Br | Bromine | 7 | 7.54 | 7.59 |
| 36 | Kr | Krypton | 8 | | |
| 37 | Rb | Rubidium | 1 | 8.47 | 2.33 |
| 38 | Sr | Strontium | 2 | 8.01 | 2.87 |
| 39 | Y | Yttrium | 3 | 7.27 | 3.26 |
| 40 | Zn | Zirconium | 4 | 7.16 | 3.53 |
| 41 | Nb | Niobium | 5 | 6.93 | 3.83 |
| 42 | Mo | Molybdenum | 6 | 6.8 | 3.92 |
| 43 | Tc | Technetium | 7 | 4.6 | 3.92 |
| 44 | Ru | Ruthenium | 8 | 6.74 | 4.2 |
| 45 | Rh | Rhodium | 9 | 6.74 | 4.3 |
| 46 | Pd | Palladium | 10 | 6.84 | 4.45 |
| 47 | Ag | Silver | 11 | 7.01 | 4.44 |
| 48 | Cd | Cadmium | 12 | 7.28 | 4.43 ± 0.1 |
| 49 | In | Indium | 3 | 7.50 | 3.1 |
| 50 | Sn | Tin | 4 | 7.81 | 4.23 |
| 51 | Sb | Antimony | 5 | 7.70 | 4.84 |
| 52 | Te | Tellurium | 6 | 7.87 | 5.49 |
| 53 | I | Iodine | 7 | 8.09 | 6.76 |
| 54 | Xe | Xenon | 8 | | |
| 55 | Cs | Cesium | 1 | 9.15 | 2.18 |
| 56 | Ba | Barium | 2 | 8.59 | 2.67 |
| 57 | La | Lanthanum | 3 | 8.05 | 3.02 |
| 58 | Ce | Cerium | 4 | 7.95 | 3.25 |
| 59 | Pr | Praseodymium | 3 | 8.03 | 3.21 |
| 60 | Nd | Neodymium | 3 | 8.00 | 3.15 ± 0.1 |
| 61 | Pr | Promethium | 3 | 8.09 | 3.21 ± 0.1 |
| 62 | Sm | Samarium | 3 | 8.00 | 2.97 ± 0.1 |
| 63 | Eu | Europium | 3 | 8.05 | 3.09 ± 0.1 |
| 64 | Gd | Gadolinium | 3 | 8.05 | 3.1 ± 0.1 |
| 65 | Tb | Terbium | 3 | 8.02 | 2.98 ± 0.1 |
| 66 | Dy | Dysprosium | 3 | 8.03 | 3.02 ± 0.1 |
| 67 | Ho | Holmium | 3 | 8.04 | 3.06 ± 0.1 |
| 68 | Er | Erbium | 3 | 8.03 | 3.16 ± 0.1 |
| 69 | Tm | Thulium | 3 | 8.03 | 3.61 |
| 70 | Yb | Ytterbium | 3 | 8.36 | 3.63 |
| 71 | Lu | Lutetium | 3 | 8.04 | 2.89 |
| 72 | Hf | Hafnium | 4 | 7.79 | 3.7 ± 0.1 |
| 73 | Ta | Tantalum | 5 | 7.59 | 4.11 |
| 74 | W | Tungsten | 6 | 7.46 | 4.4 |
| 75 | Re | Rhenium | 7 | 7.44 | 4.02 |
| 76 | Os | Osmium | 8 | 6.10 | 4.89 |
| 77 | Ir | Iridium | 9 | 7.41 | 5.33 |
| 78 | Pt | Platinum | 10 | 7.48 | 5.56 |
| 79 | Au | Gold | 11 | 7.60 | 5.77 |
| 80 | Hg | Mercury | 12 | 7.99 | 5.12 |
| 81 | Tl | Thallium | 3 | 8.17 | 3.24 |
| 82 | Pb | Lead | 4 | 8.23 | 3.89 |
| 83 | Bi | Bismuth | 5 | 8.41 | 4.12 |
| 84 | Po | Polonium | 6 | | |
| 85 | As | Astatine | 7 | | |
| 86 | Rn | Radon | 8 | | |
| 87 | Fr | Francium | 1 | | |
| 88 | Ra | Radium | 2 | | |
| 89 | Ac | Actinium | 3 | | |
| 90 | Th | Thorium | 3, 4 | 8.47 | 3.55 ± 0.1 |
| 91 | Pr | Protactinium | 3 | | |
| 92 | U | Uranium | 3 | 8.01 | 3.15 ± 0.1 |
| 93 | Np | Neptunium | 3 | | |
| 94 | Pu | Plutonium | 3 | 28.2 | 3.25 ± 0.1 |

If no range is noted for the electronegativity the range is ±0.1 ev

TABLE II

| Ne/$\chi$ values at peak | (max $\lambda$) at indicated peak |
|---|---|
| 0.465 ± .005 | 0.8 |
| 0.595 ± 0.004 | 1.0 |
| 0.655 + 0.001, −0.004 | 1.0 |
| 0.69 ± 0.003 | 0.80 |
| 0.74 ± 0.005 | 0.60 |
| 0.848 ± 0.001 | 0.55 |
| 0.875 ± 0.002 | 1.3 |
| 0.91 ± 0.002 | 1.2 |
| 0.971 ± 0.001 | 1.45 |
| 1.015 ± 0.002 | 2.85 |
| 1.07 ± 0.007 | 3.35 |
| 1.12 + 0.004, −0.01 | 2.6 |
| 1.17 ± 0.008 | 3.0 |
| 1.215 ± 0.002 | 2.45 |
| 1.28 ± 0.005 | 0.94 |
| 1.34 ± 0.01 | 0.95 |
| 1.36 ± 0.002 | 0.60 |
| 1.408 ± 0.003 | 0.90 |
| 1.45 ± 0.003 | 1.25 |
| 1.473 ± 0.002 | 0.75 |
| 1.508 ± 0.002 | 0.90 |
| 1.525 ± 0.002 | 0.55 |
| 1.578 ± 0.002 | 0.68 |
| 1.596 ± 0.002 | 0.55 |
| 1.642 + 0.005, −0.002 | 0.86 |
| 1.704 ± 0.005 | 0.68 |
| 1.80 + 0.00, −0.005 | 0.68 |
| 1.86 + 0.005 −0.01 | 0.74 |
| 1.97 ± 0.02 | 0.48 |
| 2.166 ± 0.01 | 0.65 |
| 2.16 ± 0.01 | 0.7 |
| 2.34 ± 0.01 | 0.90 |

All of the essential elements required to estimate the $T_c$ of new and novel superconductors are now present and examples of their use for specific examples follows.

The actual novel compositions which are referred to later and in the claims are arrived at by tuning a particular composition of say, AB by selection of A' or B' or both from within the same class of elements constituting A or B such that $A_{1-x}A'B$ or $AB_{1-y}B'$ or $A_{1-x}A_x'B_{1-y}B_y'$ such that the resultant composition is tuned to a single peak or near peak value of Ne/$\chi$ shown in Table 2 or FIG. 1a-1d, so as to maximize the electron phonon coupling constant. The natural result of such tuning exercise is to convert ternary to quaternary compositions or pentanary compositions and, to convert nominal ternary compositions to quaternary or pentanary compositions by the act of tuning to maximize the electron phonon coupling constant, and by the act of full or partial substitutions of A's and B's with elements of differing electronegativity such as to arrive a peak or near peak value of Ne/$\chi$ of such substituted composition of matter.

DETAILED DESCRIPTION OF THE INVENTION

The invention will be described in greater detail with reference to the drawing in which FIG. 1a-1d which is a plot of the electron phonon coupling constant $\lambda$ against the values of Ne/$\chi$ which is dependent on the number of electron per atom in the composition and the absolute electronegativity.

By utilizing both the McMillan and the Allen-Dynes experimental results, and by limiting the values of $\lambda$ derived from the McMillan equation to its range of validity, we arrive at a universal relationship between $\theta$, $T_c$, and $\lambda$. The plot of $\ln(\theta_D/2\, T_c)$ versus $\lambda^{-1}$ results in a (0,0) intercept, and in a universal equation for $T_c$ which is $$T_c = \theta_D/2 \exp[-2/\lambda]$$

Similarly, using Allen-Dynes experimental results in amorphous superconductors and plotting $\ln(\omega\log/2\, T_c)$ vs. $\lambda^{-1}$, we arrive at $$T_c = \omega\log/2 \exp[-2/\lambda], \text{ wherein } \theta_D, \text{ and } \omega\log \text{ are in units of } °K$$

The only difference in the two equations is the pre-exponential factor which represents the difference between crystalline superconductors in the McMillan case and amorphous superconductors in Allen-Dynes case. The dependence of $T_c$ on $\lambda$ remains in the same exponential form, that is, $T_{c\{EMBED\ Equation.3\}} \exp[-2/\lambda]$.

With the above equation, we can calculate reliable values of $\lambda$ for cuprate superconductors and a variety of other superconductors which heretofore has not been possible. For example, we calculate the $\lambda$ values for several well-known superconductors, which are crystalline in nature, by both our universal equation and the McMillan equation, recalling that both equations are utilized at $\mu^* = 0.10$. For $La_{1.85}Sr_{0.15}CuO_4$ whose $T_c = 38°$ K and whose $\theta_D = 365°$ K, the McMillan equation results in $\lambda = 1.68$ whereas for our universal equation $\lambda = 1.27$. The McMillan result is ~32% greater than that derived from the universal equation.

For $YBa_2Cu_3O_7$ whose $T_c = 92°$ K and whose $\theta_D = 425\, T_c$ the McMillan equation yields $\lambda = 24.1$ whereas the universal equation yields a value if 2.39. The McMillan equation, which in this case is used well beyond its limits of validity, i.e. $\lambda = 0.90$ differs from the universal equation value by an extremely high 1.008%.

For the highest $T_c$ element Niobium, whose $T_c = 9.2°$ K and whose $\theta_D = 277°$ K, the McMillan derived value of $\lambda = 0.745$, whereas the value derived from the universal equation is $\lambda = 0.737$ an insignificant difference of 1%.

In accordance with the present invention, we can calculate reliable values of $\lambda$. The $\lambda$ values for various superconductors of arbitrary compositions can be connected to electronic properties of individual atoms which, in combination or individually, possess determinable atomic electronic properties. The two atomic properties we choose are Ne [the number of valence electrons/atoms] and $\chi$ the absolute electronegativity of individual atomic species Where, $\chi[\text{electronegativity}] = I + A/2$ Where I=ionization energy [ev]/atom and A is the electron affinity/atom in units of electron volts or [ev]/atom From the preceding, we now note that an atomic property Ne/$\chi$ relevant to the electronic properties of atoms produce a reliable and reproducible response of $\lambda$ vs. Ne/$\chi$. The value $\lambda$ can be shown to achieve peak values at particular values of Ne/$\chi$, with either crystalline or amorphous superconductors as exemplified by the Allen-Dynes compounds or the elements of McMillan, and the cuprates as well. This accommodation of both amorphous and crystalline compounds illustrates the robustness of $\lambda$ vs. Ne/$\chi$. This robustness allows for the estimation of the $\lambda$ value for any arbitrary compound by calculating the value of its Ne/$\chi$ value from its constituents and the use of the universal equation for $T_c$ if $\theta_D$ is also known.

A reasonable estimate of $\theta_D$ can be made from the correlation of $\theta_D$ with the term [ln(atomic weight)+ln(atomic volume)]. Each element possesses unique values of the above terms. The value of ln(atomic weight)+ln(atomic volume) for any arbitrary compound is simply the geometric means of its constituents. The correlation equation is $\theta_D = e^{10-0.64\ \ln[(atomic\ weight)+\ln(atomic\ volume)]}$. As an example, the $\theta_D$ for $YBa_2Cu_3O_7$ is equal to $\theta_\chi^{10-0.64(6.11)} = 441°$ K and the experimental values is 447° K. For $YBa_2Cu_3O_7$ (ln atomic weight+ln atomic volume)$_{Y123} = 7.27 \times (8.59)^2 \times (6.111^3 \times (541)^7$, the product thereof=$[1.65 \times 10^{10}]^{1/13} = 6.11$ which is the geometric mean of the combined ln's of the atomic weight and atomic volume for the atomic constituents of $YBa_2Cu_3O_7$. A simpler example is that of Niobium whose (ln atomic weight+ln atomic volume)=6.93 Therefore, $$\theta_D(Nb) = e^{10-0.64(6.93)} = 261°\ K,$$

whereas the literature value for Nb=277° K.

A more recent discovery relating to superconductor $MgB_2$ is found in an article by Akamitsu, Nature (London) 410, 63 (2001), which is incorporated herein by reference. The discovery of $MgB_2$ in 2001 by Akamitsu Lab was the result of a screening of compounds that had previously not been investigated for superconductivity. Commercially available samples of $MgB_2$ were available as early as the 1950's. There were succeeding attempts by the superconductor community to discover and produce other Magnesium Diborides. The compounds $MgB_2$ did not fit the Mathias rule, and there was no evidence of other similar compounds being superconductive. The discovery of $MgB_2$ was not based on scientific theory or available methodology to guide or to explore such a compound for superconductivity. As it turned out, $MgB_2$ which is superconductive at 40° K, has proven to be a useful discovery and maintains to this day the $T_c$ record temperature for simple noncuprate superconductors. Directly after the discovery of $MgB_2$, there was a flurry of activity in the scientific community and two principle approaches were taken.

1. Doping of $MgB_2$ by substitution (either Mg substituted by Al or Boron substituted by Carbon or Be) effects for both Mg and B, while maintaining the $MgB_2$ structure. Examples were $Mg_{1-x}Al_xB_2$ and $MgB_{2-\chi}$ with $\chi$ being either Be or C.
2. The second approach was to screen or make isostructural compounds which included the Borides of the elements (Li, Be, Al) and the transition metal Borides Sc, Ti, Zr, Hf, V, Ta, Cr, Mo and Nb. The report on $TaB_2$ by Rosner and Pickett in September 2001 with Ta borides. They produced two samples of Ta borides namely, $TaB_{1.26}$ and $TaB_{2.03}$.

Both approaches provided no superconductivity.

For the above two specific samples, if we calculate the values of Ne/$\chi$ and $\theta_D$ from our graphical data, we can estimate the values of $\chi$ for these compositions and the values of $\theta_D$, and hence the expected superconducting critical temperature.

From the above values for these two compositions, we can calculate the estimated $T_c$ in °K.

For composition (1), graphically with the reference to FIGS. 1A-1D, $\lambda$ is found to be 0.25 and $\theta_D$=654° K and $T_c$=0.11° K by solving our universal equation. For composition (2), we find similarly that $\lambda$=0.25 and $\theta_D$=718° K. Therefore, $T_c$=0.13° K. The referred paper by Rosner and Pickett provided measurements of these compounds to only 1.5° K. Thus superconductivity was not observed and according with our calculations, it should not have since, both estimated $T_c$ values were less than 1.5° K.

A $TaB_2$ composition can be made to have a superconductor characteristic. For example, $Ta_{1-x}Ti_xB_2$ is found in the ternary composition range and also $Ti_{0.65}Ta_{0.35}B_2$ which has $\lambda$ value graphically of ~1.03 and an (Ne/$\chi$) of about 0.847 and $\theta_D$=829° K. Thus it can be computed that $T_c(Ti_{0.65}Ta_{0.35}B_2) \approx 88.9°$ K.

In accordance with this invention, we can establish accurate $\lambda$ values if $\theta_D$ and $T_c$ are known. The two equations that delineate the relationships are $T_c = \theta_D/2 \exp[-2/\lambda]$ and $\lambda = [\theta_D/2T_c/2]^{-1}$ The following four examples satisfy these equations:

| Composition | Ne/$\chi$ | $\theta_D$ | Estimated $\lambda$ | $T_c$ |
|---|---|---|---|---|
| $Nb_{1.95}Ti_{1.05}Sn$ | 1.174 | 259° K | 2.7 | 61° K |
| $Zr_{2.12}Nb_{0.88}Sn$ | 1.122 | 210° K | 2.5 | 41° K |
| $La_{1.20}Tm_{0.55}Sr_{0.15}CuO_4$ | 1.069 | 426° K | 3.3 | 116° K |
| $Sc_{1.0}La_{0.85}Ca_{0.15}CuO_4$ | 1.071 | 486° K | 3.3 | 132° K |

Examples 1 and 2 are in the class of A-15 type compounds, i.e., $AB_3$ and should posses a high critical field $\geq$10 Telsa. The practical applications could be in the form of wires carrying large current densities at higher temperature than now realized. The advantage would be the relaxed refrigeration requirement; other refrigerants instead of Helium could be useful, liquid refrigerant instead of helium which could be useful in MRI type applications. The wires currently used are NbTi alloys having a $T_c$ of ~10-11° K and can operate only at liquid Helium temperatures.

Example 3 is a compound related to the original Bednorz-Mueller discovery of $La_{1.85}Ba_{0.15}CuO_4$ for which they won the Nobel Prize. The novel composition disclosed herein optimizes the Copper layer structure having nontoxic elements in its composition to achieve a $T_c$~132° K which heretofore has only been obtained with compounds containing toxic elements, such as Mercury (Hg) and Thallium (Tl). Such compounds were more complex, containing three Copper layers per composition in contrast to the single Copper layer used in the novel composition disclosed herein. For example 3 and 4, the preparation process would preferably be conducted under high pressure to ensure the desired structure.

Another Example is the same class as preceding Examples 1 and 2.

EXAMPLE 4

| Composition | Ne/$\chi$ | $\theta_D$ | $\lambda$ | $T_c$ |
|---|---|---|---|---|
| $V_{2.655}Nb_{0.345}Si$ | 1.215 | 449° K | ~2.45 | 99° K |

This represents a composition in the A-15 class which has the potential to be refrigerated by liquid Nitrogen i.e. ~77° K and would be expected to have a high critical field as well.

The following lists Examples of optimized Superconductive compositions:

EXAMPLES OF OPTIMIZED SUPERCONDUCTIVE COMPOSITIONS

Example 1

A-15 Type, $V_{2.655}Nb_{0.345}Si_{0.885}Ge_{0.115}$

Ne/$\chi$=1.216; $\lambda$~2.45; $\theta_D$~440° K; $T_c$~97° K

Example 2

A-15 Type, $Nb_3Ge_{0.245}Al_{0.755}$

Ne/$\chi$=1.216; $\lambda$~2.45; $\theta_D$~307° K; $T_c$~62° K

Example 3

$MgB_2$ Type, $Mg_{0.8}Sc_{0.1}Na_{0.1}B_2$

Ne/$\chi$=0.656; $\lambda$~1.0; $\theta_D$~940° K; $T_c$~63° K

Example 3a

Cuprate, $La_{1.33}Tm_{0.52}Sr_{0.15}CuO_4$

Ne/$\chi$=1.07; $\lambda$~3.3; $\theta_D$~420° K; $T_c$~109° K

Example 4

Cuprosulfide, $Sc_{1.85}Sr_{0.15}CuS_4$

Ne/$\chi$=1.175; $\lambda$~3; $\theta_D$~391° K; $T_c$~100° K

Example 5

Cuproselenide, $Sc_{1.85}Ba_{0.15}CuSe_4$

Ne/$\chi$=1.214; $\lambda$~2.3; $\theta_D$~270° K; $T_c$~56° K

Example 6

Intermetallic, $Mg_2Ni_{0.53}Pt_{0.47}$ $Ne/\chi = 1.125$; $\lambda \sim 2.5$; $\theta_D \sim 457°$ K; $T_c \sim 101°$ K

Example 6a

Intermetallic, $Mn_{0.90}Mo_{0.10}Al_{12}$ $Ne/\chi = 1.016$; $\lambda \sim 2.7$; $\theta_D \sim 596°$ K; $T_c \sim 142°$ K

Example 7

Cuprate, $Mg_{0.765}Be_{0.135}CuO_2$ $Ne/\chi = 1.12$; $\lambda \sim 2.6$; $\theta_D \sim 605°$ K; $T_c \sim 140°$ K

Example 8

Bismuth Sulfide, $Ba_{0.6}Na_{0.30}K_{0.10}BiS_3$ $Ne/\chi = 1.015$; $\lambda \sim 2.5$; $\theta_D \sim 269°$ K; $T_c \sim 60°$ K

Example 8a

Bismuth Selenide, $Ba_{0.65}Rb_{0.35}BiSe_3$ $Ne/\chi = 1.063$; $\lambda \sim 3.0$; $\theta_D \sim 163°$ K; $T_c \sim 42°$ K

Example 9

Titanium Selenide, $RbTi_2Se_4$ $Ne/\chi = 1.064$; $\lambda \sim 3.0$; $\theta_D \sim 241°$ K; $T_c \sim 61°$ K

Example 10

Cuprate, $ScMg_{1.5}Ca_{0.5}Cu_3O_7$ $Ne/\chi = 1.124$ $\lambda \sim 2.5$; $\theta_D \sim 557°$ K; $T_c \sim 125°$ K

Example 11

Intermetallic, $Mg_3Au_{0.81}Ag_{0.19}$ $Ne/\chi = 1.016$; $\lambda \sim 2.7$; $\theta_D \sim 415°$ K; $T_c \sim 99°$ K

Example 12

Cuprate, $PdMgBe_2Cu_3O_{8.45}$ $Ne/\chi \sim 1.074$; $\lambda \sim 3.3$; $\theta_D \sim 652°$ K; $T_c \sim 177°$ K

Example 13

$Pd\,Mg_{1.12}Be_{0.88}CuO_{4.15}$ $Ne/\chi \sim 1.069$; $\lambda \sim 3.3$; $\theta_D \sim 626°$ K; $T_c \sim 170°$ K

Example 14

Silicide, $V_{0.59}Mo_{0.4}Si_2$ $Ne/\chi \sim 1.017$; $\lambda \sim 2.6$; $\theta_D \sim 477°$ K; $T_c \sim 110°$ K

Example 15

Intermetallic, $Cr_{0.914}V_{0.086}Al_3$ $Ne/\chi \sim 1.12$; $\lambda \sim 2.50$; $\theta_D \sim 578°$ K; $T_c \sim 129°$ K

Example 16

Intermetallic Aluminum deficient, $MoAl_{2.9}$ $Ne/\chi \sim 1.115$; $\lambda \sim 2.5$; $\theta_D \sim 509°$ K; $T_c \sim 114°$ K

Example 17

Cuprate (oxide) $YMg_2Cu_3O_7$ $Ne/\chi \sim 1.117$; $\lambda \sim 2.5$; $\theta_D \sim 552°$ K; $T_c \sim 124°$ K

Example 18

CuproSulfide, $YBe_{1.06}Mg_{0.94}Cu_3S_7$ $Ne/\chi \sim 1.215$; $\lambda \sim 2.45$; $\theta_D \sim 476°$ K; $T_c \sim 105°$ K

Example 19

Diboride, $Sc_{0.6}La_{0.4}RuB_2$ $Ne/\chi \sim 1.069$; $\lambda \sim 3.3$; $\theta_D \sim 621°$ K; $T_c \sim 169°$ K

Example 20

Transition Metal MonoBoride, $Ti_{0.98}V_{0.02}B$ $Ne/\chi \sim 0.91$; $\lambda \sim 1.2$; $\theta_D \sim 744°$ K; $T_c \sim 70°$ K

Example 21

Transition Metal Monoboride, $V_{0.47}Cr_{0.53}B$ $Ne/\chi \sim 1.073$; $\lambda \sim 3.3$; $\theta_D \sim 790°$ K; $T_c \sim 215°$ K

Example 22

Transition Metal Pentaboride, $Mo_{1.16}W_{0.84}B_5$ $Ne/\chi \sim 0.91$; $\lambda \sim 1.2$; $\theta_D \sim 831°$ K; $T_c \sim 78°$ K

Example 23

Transition Metal Pentaboride, $Mo_{1.78}Ti_{0.22}B_5$ $Ne/\chi \sim 0.91$; $\lambda \sim 1.2$; $\theta_D \sim 870°$ K; $T_c \sim 82°$ K

Example 24

Transition Metal Tetraboride, $Cr_{2.78}Mn_{0.22}B_4$ $Ne/\chi \sim 1.07$; $\lambda \sim 3.3$; $\theta_D \sim 858°$ K; $T_c \sim 234°$ K

Example 25

Boron Deficient Transition Metal Tetraboride, $Cr_3B_{3.95}$ $Ne/\chi \sim 1.065$; $\lambda \sim 3.0$; $\theta_D \sim 857°$ K; $T_c \sim 220°$ K

Example 26

Intermetallic, $Mg_2Si_{0.885}Sn_{0.115}$ $Ne/\chi \sim 0.652$; $\lambda \sim 1.0$; $\theta_D \sim 510°$ K; $T_c \sim 34°$ K

Example 27

$Au_{0.95}Cu_{0.05}Be_3$ $Ne/\chi \sim 0.876$; $\lambda \sim 1.3$; $\theta_D \sim 956°$ K; $T_c \sim 102°$ K

Example 28

Intermetallic, $Ti_{0.59}Nb_{0.25}V_{0.16}Al_3$ $Ne/\chi \sim 1.016$; $\lambda \sim 2.6$; $\theta_D \sim 543°$ K; $T_c \sim 126°$ K

Example 29

Cuprate, $TmBe_2Cu_3O_7$ $Ne/\chi \sim 1.077$; $\lambda \sim 3.0$; $\theta_D \sim 640°$ K; $T_c \sim 161°$ K

Example 30

Boride, $TiB_{0.98}$ $Ne/\chi \sim 0.91$; $\lambda \sim 1.2$; $\theta_D \sim 907°$ K; $T_c \sim 91°$ K

Example 31

Monoboride, $Zr_{0.90}V_{0.10}B$ $Ne/\chi \sim 0.91$; $\lambda \sim 1.2$; $\theta_D \sim 600°$ K; $T_c \sim 56°$ K

Example 32

Monoboride, $Cr_{0.60}Nb_{0.40}B$ $Ne/\chi \sim 1.07$; $\lambda \sim 3.3$; $\theta_D \sim 725°$ K; $T_c \sim 186°$ K

Example 33

Intermetallic, $IrSn_{2.96-2.98}$ $Ne/\chi \sim 1.171$; $\lambda \sim 3.0$; $\theta_D \sim 159°$ K; $T_c \sim 41°$ K

Example 34

Intermetallic, $Ir_3Sn_{6.9}$ $Ne/\chi \sim 1.215$; $\lambda \sim 2.6$; $\theta_D \sim 161°$ K; $T_c \sim 37°$ K

Example 35

A composition of matter specified by $Re_{0.925}B_2$, $Ne/\chi = 1.015$, $\theta_D$ is $752°$ K, $\lambda = 2.8$ and whose Tc=184° K.

Example 36

A composition of matter specified by $Re_{0.55}B_2$, $Ne/\chi = 0.913$, $\theta_D$ is $893°$ K, $\lambda = 1.20$ and whose Tc=84° K.

Example 37

A composition of matter whose composition is $V_{0.82}B_2$ $Ne/\chi = 0.876$, $\theta_D$ is $950°$ K, $\lambda = 1.3$ and whose Tc=101° K.

Example 38

A composition of matter where composition is $V_{0.655}B_2$ $Ne/\chi = 0.848$, $\theta_D$ is $990°$ K, $\lambda = 1.3$ and whose Tc=106° K.

Example 39

Alloys of Cu, Ni, Pt, Pd, Ir, Au, Ag C $Ne/\chi = 2.34$

| Alloys | Compound | $Ne/\chi$ | $\theta_D$ | $T_c$ |
|---|---|---|---|---|
| Binary | $Ag_{.785}Au_{0.215}$ | 2.34 | 233° K | 12.7° K |
|  | $Pd_{0.55}Cu_{.45}$ | 2.34 | 314° K | 20.2° K |
|  | $Cu_{.81}Au_{.19}$ | 2.34 | 374° K | 20° K |
| Ternary | $Cu_{.40}Pd_{.275}Ni_{0.325}$ | 2.34 | 402° K | 22° K |
|  | $Cu_{0.75}Pt_{0.1575}Ag_{0.925}$ | 2.34 | 369° K | 20° K |
| Quaternary | $Cu_3Ag_{0.30}Au_{.385}Pt_{.315}$ | 2.34 | 365° K | 19.7° K |
| Peranary | $Cu_3Ag_{0.225}Ir_{0.275}Au_{0.32}Pd_{0.18}$ | 2.34 | 340° K | 18.4° K |
| Hexanary | $Cu_3Ag_{0.2625}Au_{0.3525}Pt_{0.1575}Ir_{0.1375}Pd_{0.09}$ | 2.34 | 368° K | 19.9° K |

Example 40

A composition of matter where composition is
$Ta_{0.93}Zr_{0.07}$,

Ne/$\chi$=1.212, $\theta_D$~175° K, $\lambda$~2.4 and whose $T_c$~38° K.

Example 41

A composition of matter where composition is
$Ta_{0.93}Zr_{0.035}Ti_{0.035}$,

Ne/$\chi$=1.213, $\theta_D$~179° K, $\lambda$~2.4 and whose $T_c$~39° K.

Example 42

A composition of matter where composition is
$Mg_{0.88}Sc_{0.06}Na_{0.06}B_2$,

Ne/$\chi$=0.653, $\theta_D$=943° K, $\lambda$~1.0 and whose Tc~63.8° K.

What is claimed is:

1. Superconductor compositions that are electrically conductive comprising a multiplicity of different species of atoms, characterized by having an Ne/$\chi$ value that is not a peak or near peak value of $\lambda$, where Ne is the average number of valence electrons in the composition, and $\chi$ is the absolute value of the electronegativity of the composition, and $\lambda$ is the electron phonon coupling constant, wherein Ne/$\chi$ can be shifted to peak or near peak value by substitution or partial substitution of at least one of said species of atoms with an atomic species having and electronegativity different from at least one of said species of atoms which is being replaced by said substitution, said substitution resulting in a superconductive composition of matter wherein Ne/$\chi$ peak or near peak values include one of the following values: 0.465±0.005, 0.595±0.004, 0.655+0.001, −0.004, 0.69±0.003, 0.74±0.005, 0.848±0.001, 0.875±0.002, 0.91±0.002, 0.971±0.001, 1.015±0.002, 1.07±0.007, 1.12+0.004, −0.01, 1.17±0.008, 1.215±0.002, 1.28±0.005, 1.34±0.01, 1.36±0.002, 1.408±0.003, 1.45±0.003, 1.473±0.002, 1.508±0.002, 1.525±0.002, 1.578±0.002, 1.596±0.002, 1.642+0.005, −0.002, 1.704±0.005, 1.80+0.00, −0.005, 1.86+0.005−0.01, 1.97±0.02, 2.166±0.01, 2.16±0.01, 2.34±0.01 wherein the superconducting composition is a composition selected from the group consisting of $Mg_{0.80}Sc_{0.10}Na_{0.10}B_2$ and $Mg_{0.88}Sc_{0.06}Na0.06B_2$.

2. Superconductive compositions that are electrically conductive and amorphous, wherein the amorphicity is induced by at least one of the following atomic species, Be, B, Si, Ge, or P and the metallicity is provided by a combination of at least one of the following elements: Y, Sc, Ti, Zr, Hf, V, Nb, Ta, Cr, Mo, Tc, Mn, Re, W, Fe, Ru, Os, Co, Rh, Ir, Ni. Pd, Pt, Cu, Ag, Au, Zn, Cd, or Hg, wherein said compositions contain at least 10 total atomic percent of the said amorphicity inducing element, the remaining percentage of said composition consisting of one or more of said metallicity inducing elements, wherein said final composition must achieve one of the following Ne/$\chi$ values: 0.655+0.001, −0.004, 0.69±0.003, 0.875±0.002, 0.91±0.002, 0.971±0.001, 1.015±0.002, 1.07±0.007, 1.12+0.004, −0.01, 1.17±0.008, 1.215±0.002, 1.642+0.005, −0.002 or 2.34±0.01 wherein the superconducting composition is a composition selected from the group consisting of $Ti_{0.51}Nb_{0.15}V_{0.20}Si_{0.084}B_{0.051}$, $Ti_{0.50}V_{0.15}Nb_{0.15}B_{0.10}Si_{0.11}$.

* * * * *